(12) United States Patent
Sharma

(10) Patent No.: US 12,527,021 B2
(45) Date of Patent: Jan. 13, 2026

(54) SUBSTRATE BIASING FOR BIDIRECTIONAL HIGH ELECTRON MOBILITY TRANSISTOR DEVICE

(71) Applicant: GlobalFoundries U.S. Inc., Malta, NY (US)

(72) Inventor: Santosh Sharma, Austin, TX (US)

(73) Assignee: GlobalFoundries U.S. Inc., Malta, NY (US)

( * ) Notice: Subject to any disclaimer, the term of this patent is extended or adjusted under 35 U.S.C. 154(b) by 745 days.

(21) Appl. No.: 17/823,112

(22) Filed: Aug. 30, 2022

(65) Prior Publication Data

US 2024/0072161 A1   Feb. 29, 2024

(51) Int. Cl.
*H10D 30/47*  (2025.01)
*H03K 17/687*  (2006.01)
*H10D 62/85*  (2025.01)

(52) U.S. Cl.
CPC ....... *H10D 30/475* (2025.01); *H03K 17/6871* (2013.01); *H10D 62/8503* (2025.01)

(58) Field of Classification Search
CPC ............. H10D 30/475; H10D 62/8503; H03K 17/6871; H03K 17/687; H03K 2017/6878; H03K 2217/0018
See application file for complete search history.

(56) References Cited

U.S. PATENT DOCUMENTS

| | | | |
|---|---|---|---|
| 8,785,973 B2 | 7/2014 | Vashchenko | |
| 10,651,843 B1 | 5/2020 | Kinzer et al. | |
| 12,057,824 B2* | 8/2024 | Sharma | H03K 17/08142 |
| 2009/0065810 A1* | 3/2009 | Honea | H10D 64/411 |
| | | | 257/192 |
| 2014/0374766 A1 | 12/2014 | Bahl et al. | |
| 2016/0372920 A1 | 12/2016 | Kinzer et al. | |
| 2018/0026029 A1 | 1/2018 | Lin et al. | |

FOREIGN PATENT DOCUMENTS

EP   3562040 A1   10/2019

* cited by examiner

*Primary Examiner* — Lincoln D Donovan
*Assistant Examiner* — Amit R Bhatia
(74) *Attorney, Agent, or Firm* — David Cain; Hoffman Warnick LLC

(57) ABSTRACT

Embodiments of the present disclosure provide a semiconductor device, including: a high electron mobility transistor (HEMT) bidirectional switch including: a first source at a first potential; a second source at a second potential different than the first potential; and a substrate; and a biasing circuit, coupled to the first source of the bidirectional switch and the second source of the bidirectional switch, for biasing the substrate at a potential equal to the lower of the first potential of the first source of the bidirectional switch and the second potential of the second source of the bidirectional switch.

11 Claims, 3 Drawing Sheets

SUBSTRATE BIASING FOR BIDIRECTIONAL HIGH ELECTRON MOBILITY TRANSISTOR DEVICE

TECHNICAL FIELD

Embodiments of the disclosure relate generally to integrated circuits. More specifically, the disclosure provides a method and circuit for biasing the substrate of a bidirectional high electron mobility transistor (HEMT) high voltage device.

BACKGROUND

High-electron-mobility field effect transistors (HEMTs) are viewed as an attractive candidate for power transistor applications, i.e., applications in which switching of substantially large voltages and/or currents is required. HEMTs offer high conduction and low resistive losses in comparison to conventional silicon based devices.

HEMTs are commonly formed from III-V semiconductor materials, such as GaN, GaAs, InGaN, AlGaN, etc. In a GaN/AlGaN based HEMT, for example, a two-dimensional electron gas (2DEG) arises at the interface between the AlGaN barrier layer and the GaN buffer layer. The 2DEG forms the channel of the device.

One application of type III-V semiconductor technology is a bidirectional switch. A bidirectional switch is a device that can switch voltages of positive or negative polarity. That is, a bidirectional switch is configured to control (allow/block) current flow in both directions. One problem associated with bidirectional switches relates to capacitive coupling between the channel of the device and the underlying semiconductor substrate. In conventional unidirectional semiconductor switching devices, the underlying semiconductor substrate is typically tied to the source terminal of the device by substrate contacts. By tying the substrate to a fixed potential, the problem of capacitive coupling between a floating substrate and the channel is eliminated and hence the reliability and stability of the device operation is improved. The same benefit cannot be obtained using a simple electrical contact in the case of a bidirectional switch that includes two source terminals because either source terminal can assume a high voltage requiring the substrate to be tied to the lower voltage source terminal.

SUMMARY

Aspects of the disclosure provide a semiconductor device, including: a high electron mobility transistor (HEMT) bidirectional switch including: a first source at a first potential; a second source a second potential different than the first potential; and a substrate; and a biasing circuit, coupled to the first source of the bidirectional switch and the second source of the bidirectional switch, for biasing the substrate at a potential equal to the lower of the first potential of the first source of the bidirectional switch and the second potential of the second source of the bidirectional switch.

Another aspect of the disclosure includes the preceding aspect, and wherein the bidirectional switch includes an enhancement mode (EMODE) HEMT.

Another aspect of the disclosure includes any of the preceding aspects, and wherein the biasing circuit further includes a first enhancement mode (EMODE) HEMT connected in series with a second EMODE HEMT, wherein: a drain of the first EMODE HEMT is coupled to the first source of the bidirectional switch; a drain of the second EMODE HEMT is coupled to the second source of the bidirectional switch; and a source of the first EMODE HEMT and a source of the second EMODE HEMT are coupled to the substrate of the bidirectional switch.

Another aspect of the disclosure includes any of the preceding aspects, and wherein the biasing circuit further includes a first depletion mode (DMODE) HEMT coupled in series with a second DMODE HEMT, wherein: a drain of the first DMODE HEMT is coupled to the first source of the bidirectional switch; a drain of the second DMODE HEMT is coupled to the second source of the bidirectional switch; and a gate of the first DMODE HEMT is coupled to a gate of the second DMODE HEMT and the substrate of the bidirectional switch.

Another aspect of the disclosure includes any of the preceding aspects, and wherein a source of the first DMODE HEMT is coupled to a gate of the second EMODE HEMT, and a source of the second DMODE HEMT is coupled to a gate of the first EMODE HEMT.

Another aspect of the disclosure includes any of the preceding aspects, and wherein the biasing circuit further includes a third EMODE HEMT coupled to a fourth EMODE HEMT, wherein: a drain of the third EMODE HEMT is coupled to the first source of the bidirectional switch; a drain of the fourth EMODE HEMT is coupled to the second source of the bidirectional switch; a source of the third EMODE HEMT is coupled to a gate of the third EMODE HEMT; and a source of the fourth EMODE HEMT is coupled to a gate of the fourth EMODE HEMT.

Another aspect of the disclosure includes any of the preceding aspects, and wherein the source of the third EMODE HEMT and the source of the fourth EMODE HEMT are coupled to the gate of the first DMODE HEMT and the gate of the second DMODE HEMT.

Another aspect of the disclosure includes any of the preceding aspects, and wherein, when the first potential of the first source of the bidirectional switch is greater than the second potential of the second source of the bidirectional switch: the first DMODE HEMT is pinched-off; the second EMODE HEMT is in an on state; and the substrate of the bidirectional switch is biased at the second potential.

Another aspect of the disclosure includes any of the preceding aspects, and wherein, when the first potential of the first source of the bidirectional switch is greater than the second potential of the second source of the bidirectional switch, the source of the first DMODE HEMT is at a potential equal to a pinch-off voltage of the first DMODE HEMT and a threshold voltage of the fourth EMODE HEMT.

Another aspect of the disclosure includes any of the preceding aspects, and wherein, when the second potential of the second source of the bidirectional switch is greater than the first potential of the first source of the bidirectional switch: the second DMODE HEMT is pinched-off; the first EMODE HEMT is in an on state; and the substrate of the bidirectional switch is biased at the first potential.

Another aspect of the disclosure includes any of the preceding aspects, and wherein, when the second potential of the second source of the bidirectional switch is greater than the first potential of the first source of the bidirectional switch, the source of the second DMODE HEMT is at a potential equal to a pinch-off voltage of the second DMODE HEMT and a threshold voltage of the third EMODE HEMT.

Another aspect of the disclosure includes any of the preceding aspects, and wherein the biasing circuit includes a first set of enhancement mode (EMODE) HEMTs, a set of depletion mode (DMODE) HEMTs coupled to the first set of EMODE HEMTs, and a second set of EMODE HEMTs coupled to the set of DMODE HEMTs.

Another aspect of the disclosure includes any of the preceding aspects, and wherein the bidirectional switch, the first set of EMDOE HEMTs, the set of DMODE HEMTs, and the second set of EMODE HEMTs are monolithically integrated on a gallium nitride (GaN) wafer.

Another aspect of the disclosure is directed to a biasing circuit for biasing a substrate of a transistor device, including: a first enhancement mode (EMODE) high electron mobility transistor (HEMT) in series with a second EMODE HEMT, wherein a source of the first EMODE HEMT and a source of the second EMODE HEMT are coupled to the substrate of the transistor device; a first depletion mode (DMODE) HEMT in series with a second DMODE HEMT, wherein the first DMODE HEMT and the second DMODE MEMT are cross-coupled with the first EMODE HEMT and the second EMODE HEMT; and a third EMODE HEMT in series with a fourth EMODE HEMT, wherein a source and a gate of the third EMODE HEMT and a source and gate of the fourth EMODE HEMT are coupled to the substrate of the transistor device, a gate of the first DMODE HEMT, and a gate of the second DMODE HEMT, wherein a drain of each of the first EMODE HEMT, the first DMODE HEMT, and the third EMODE HEMT are coupled to a first source of the transistor device, and wherein a drain of each of the second EMODE HEMT, the second DMODE HEMT, and the fourth EMODE HEMT are coupled to a second source of the transistor device.

Another aspect of the disclosure includes any of the preceding aspects, and wherein the first source of the transistor device is at a first potential and the second source of the transistor device is at a second potential different than the first potential, and wherein the biasing circuit is configured to bias the substrate of the transistor device at a potential equal to the lower of the first potential of the first source of the transistor device and the second potential of the second source of the transistor device.

Another aspect of the disclosure includes any of the preceding aspects, and wherein: a source of the first DMODE HEMT is coupled to a gate of the second EMODE HEMT; a source of the second DMODE HEMT is coupled to a gate of the first EMODE HEMT; a gate of the first DMODE HEMT is coupled to a gate of the second DMODE HEMT and the substrate of the transistor device; a source of the third EMODE HEMT is coupled to a gate of the third EMODE HEMT and the gates of the first and second DMODE HEMTs; and a source of the fourth EMODE HEMT is coupled to a gate of the fourth EMODE HEMT and the gates of the first and second DMODE HEMTs.

Another aspect of the disclosure includes any of the preceding aspects, and wherein the transistor device comprises a EMODE HEMT bidirectional switch.

Another aspect of the disclosure includes any of the preceding aspects, and wherein: when the first potential of the first source of the transistor device is greater than the second potential of the second source of the transistor device: the first DMODE HEMT is pinched-off; the second EMODE HEMT is in an on state; and the substrate of the transistor device is biased at the second potential; and when the second potential of the second source of the transistor device is greater than the first potential of the first source of the transistor device: the second DMODE HEMT is pinched-off; the first EMODE HEMT is in an on state; and the substrate of the transistor device is biased at the first potential.

Another aspect of the disclosure is directed to a method for biasing a high electron mobility transistor (HEMT) bidirectional switch, the bidirectional switch including a substrate, a first source at a first potential, and a second source at a second potential different than the first potential, including: biasing the substrate of the bidirectional switch at the first potential if the first potential is lower than the second potential; and biasing the substrate of the bidirectional switch at the second potential if the second potential is lower than the first potential.

These and other features of this disclosure will be more readily understood from the following detailed description of the various aspects of the disclosure taken in conjunction with the accompanying drawings that depict various embodiments of the disclosure.

Figure 1:
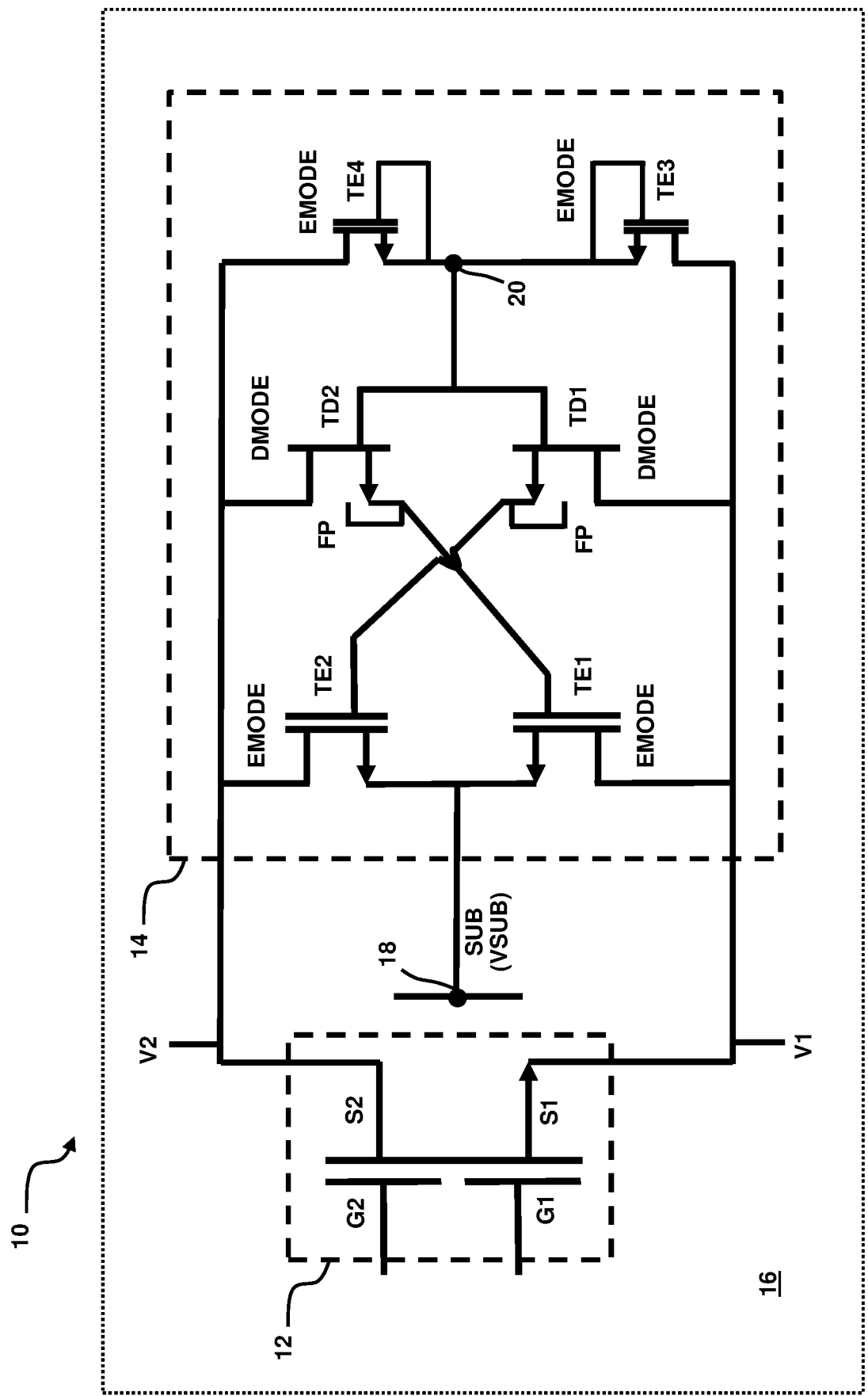
FIG. 1 depicts a semiconductor device including a biasing circuit for biasing the substrate of a bidirectional high electron mobility transistor (HEMT) device according to embodiments of the disclosure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

In the following description, reference is made to the accompanying drawings that form a part thereof, and in which is shown by way of illustration specific exemplary embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

FIG. 1 depicts a semiconductor device 10 including a gallium nitride (GaN), enhancement mode (EMODE), bidirectional high electron mobility transistor (HEMT) switch 12 (hereafter bidirectional switch 12). The semiconductor device 10 further includes a biasing circuit 14 for biasing the substrate 16 on which the bidirectional switch 12 and the biasing circuit 14 are formed according to embodiments of the disclosure. Advantageously, the bidirectional switch 12 and the components of the biasing circuit 14 may be monolithically integrated on a GaN wafer.

The bidirectional switch 12 includes a first gate G1, a second gate G2, a first source S1, a second source S2, and a common drain (not shown). The source S1 of the bidirectional switch 12 is coupled to a first potential V1 and the source S2 of the bidirectional switch 12 is coupled to a second potential V2. Based on the on/off states of the first gate G1 and the second gate G2, the bidirectional switch 12 operates as follows: on/on (gates G1 and G2 are both on); off/off (gates G1 and G2 are both off); on/off (gate G1 is on and gate G2 is off); and off/on (gate G1 is off and gate G2 is on). In operation, with gates G1 and G2 both on, the bidirectional switch 12 selectively passes current from the source S1 to the source S2 or from the source S2 to the source S1 in a symmetrical manner based on the relative potentials applied to the sources S1, S2 of the bidirectional switch 12. Further, the bidirectional switch 12 may block current flow between the source S1 and the source S2 in a symmetrical manner when the gates G1, G2 are off/off, on/off, or off/off.

The biasing circuit 14 is configured to clamp the voltage VSUB at the substrate 16 to the lower of the potentials V1, V2 applied to sources S1, S2, respectively, of the bidirectional switch 12. As depicted in FIG. 1, the source S1 and the source S2 are coupled to the biasing circuit 14.

The biasing circuit 14 includes a plurality of high voltage HEMTs, including both EMODE HEMTs and depletion mode (DMODE) HEMTs. This allows the components of the biasing circuit 14 to be fabricated on the same GaN wafer as the bidirectional switch 12.

As shown in FIG. 1, the biasing circuit 14 includes a first GaN EMODE HEMT (hereafter TE1) in series with a second GaN EMODE HEMT (hereafter TE2). The drain of the transistor TE1 is coupled to the source S1 of the bidirectional switch 12 and the drain of the transistor TE2 is coupled to the source S2 of the bidirectional switch 12. The source of the transistor TE1 is coupled to the source of the transistor TE2 and to the substrate 16 (e.g., via a substrate terminal 18 as shown).

The biasing circuit 12 further includes a first GaN DMODE HEMT (hereafter TD1) and a second GaN DMODE HEMT (hereafter TD2). The drain of the transistor TD1 is coupled to the source S1 of the bidirectional switch 12 and the drain of the transistor TD2 is coupled to the source S2 of the bidirectional switch 12. The gate of the transistor TD1 is coupled at a node 20 to the gate of the transistor TD2 and the substrate 16.

As depicted in FIG. 1, the transistors TE1 and TE2 are cross-coupled in parallel to the transistors TD1 and TD2. In particular, the source of the transistor TD1 is coupled to the gate of the transistor TE2 and the source of the transistor TD2 is coupled to the gate of the transistor TE1. As shown, the field plates FP of the transistors TD1 and TD2 may be connected to the sources of the transistors TD1, TD2, respectively, or may be coupled to the gates of the transistors TD1, TD2, respectively (not shown). The gates of the transistors TD1 and TD2 are coupled to the node 20.

With continuing reference to FIG. 1, the biasing circuit 14 further includes a third GaN EMODE HEMT (hereafter TE3) in series with a fourth GaN EMODE HEMT (hereafter TE4). The drain of the transistor TE3 is coupled to the source S1 of the bidirectional switch 12 and the drain of the transistor TE4 is coupled to the source S2 of the bidirectional switch 12. The transistor TE3 and the transistor TE4 are each diode connected such that the source and gate of the transistor TE3 are connected together to form a first diode and the source and gate of the transistor TE4 are connected together to form a second diode. The source/gate connections of the transistors TE3, TE4 are coupled to node 20.

Figure 2:
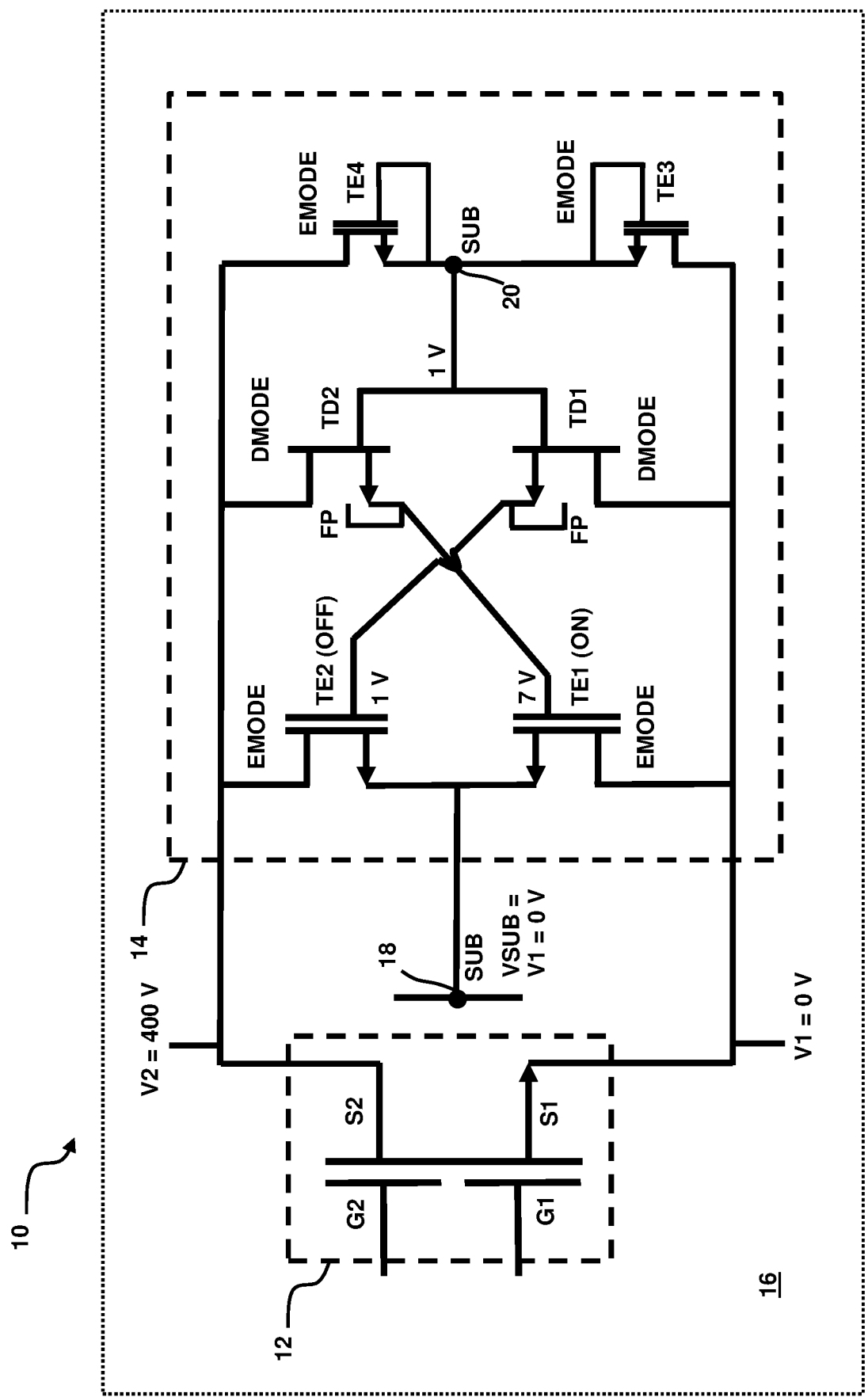
FIG. 2 depicts an example of the operation of the biasing circuit of FIG. 1 according to embodiments of the disclosure.

An example of a first mode of operation of the biasing circuit 14 according to embodiments is depicted in FIG. 2. In this example, the source S1 of the bidirectional switch 12 is biased at a lower potential (e.g., V1=0 V) than the potential (e.g., V2=400 V) of the source S2 of the bidirectional switch 12. In this case, the biasing circuit 14 is configured to bias the substrate 16 at the lower of the potentials V1, V2 applied to the sources S1, S2 of the bidirectional switch 12. That is, in this example, the biasing circuit 14 is configured to bias the substrate 16 at a potential of VSUB=V1=0 V.

When the source S1 of the bidirectional switch 12 is biased at a potential V1=0 V and the source S2 of the bidirectional switch 12 is biased at a potential V2=400 V, the transistor TE3 is in an ON state and the transistor TE4 is in an OFF state. To this extent, the potential at node 20 is equal to the potential V1 applied to the source S1 of the bidirectional switch 12 plus the threshold voltage $V_{TH-TE3}$ (e.g., 1 V) of the transistor TE3. Thus, since the potential applied to the source S1 of the bidirectional switch 12 is V1=0 V, the potential at node 20 is the threshold voltage $V_{TH-TE3}$ of the transistor TE3.

The potential $V_{TH-TE3}$ at node 20 is applied to the gates of the DMODE transistors TD1, TD2. As a result, the transistor TD1 is in an ON state and the transistor TD2 is in an OFF state. In the ON state, the source of the transistor TD1 is pulled to the potential V1=0 V applied to the source S1 of the bidirectional switch 12. In the OFF state, the transistor TD2 is pinched-off and the source of the transistor TD2 is at a potential equal to the pinch-off voltage $V_{PO-TD2}$ (e.g., 6 V) of the transistor TD2 plus the threshold voltage $V_{TH-TE3}$ (1 V) of the transistor TE3.

In the cross-coupled configuration depicted in FIG. 2, the potential (0 V) at the source of the transistor TD1 is applied to the gate of the transistor TE2 and the potential (7 V) at the source of the transistor TD2 is applied to the gate of the transistor TE1. As such, the transistor TE2 is in an OFF state and the transistor TE1 is in an ON state. The transistor TD2 thus operates as a biasing device to pull up the gate of the transistor TE1 to a voltage sufficient to turn on the transistor TE1.

With the transistor TE1 in an ON state, the source of the transistor TE1 and thus the potential VSUB of the substrate 16 are pulled to the potential V1=0 V applied to the source S1 of the bidirectional switch 12. Thus, the biasing circuit 14 is configured to clamp the voltage VSUB at the substrate 16 to the lower (V1=0 V) of the potentials V1, V2 applied to sources S1, S2 of the bidirectional switch 12.

Figure 3:
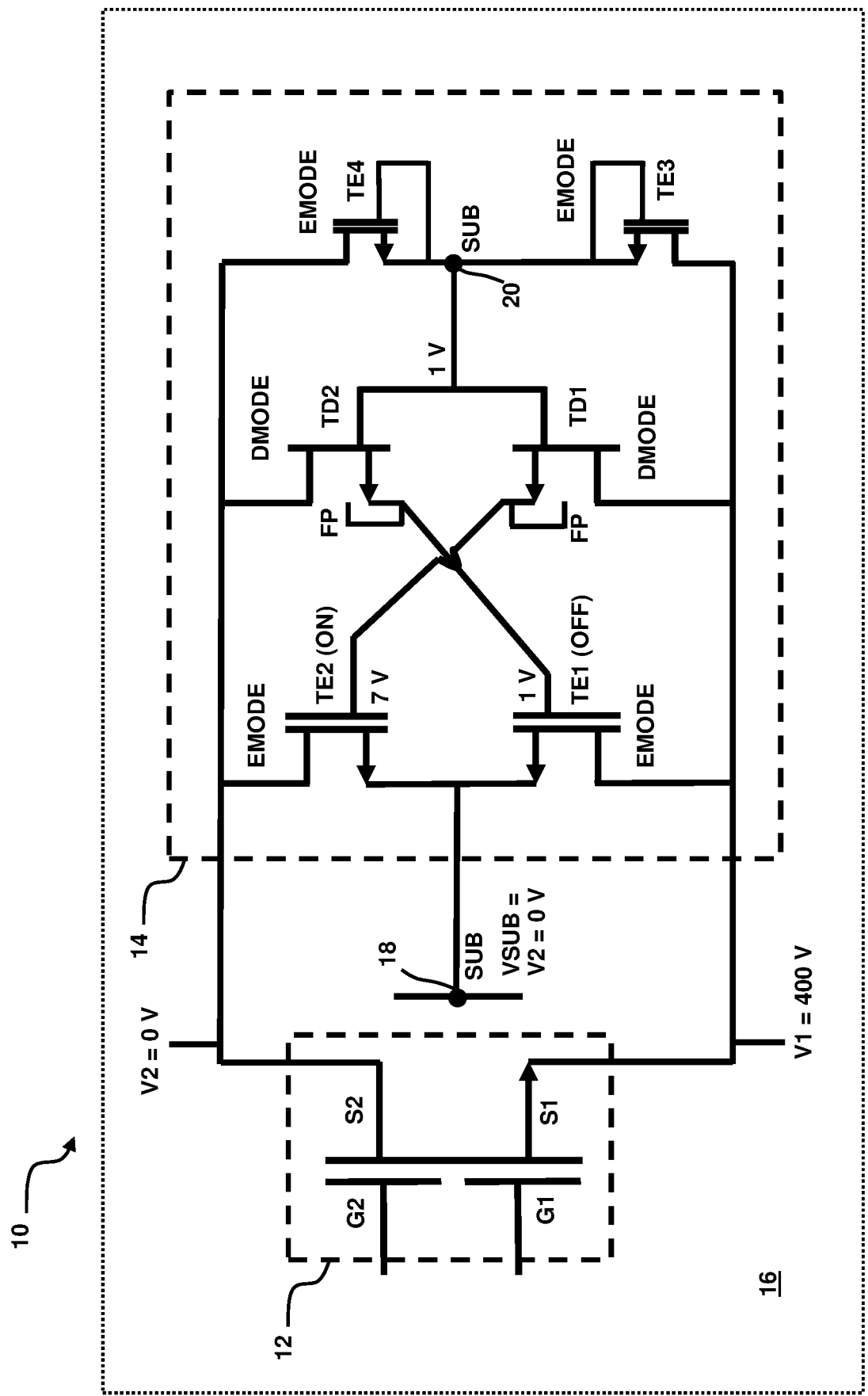
FIG. 3 depicts another example of the operation of the biasing circuit of FIG. 1 according to embodiments of the disclosure.

An example of a second mode of operation of the biasing circuit 14 according to embodiments is depicted in FIG. 3. In this example, the source S2 of the bidirectional switch 12 is biased at a lower potential (V2=0 V) than the potential (V1=400 V) of the source S1 of the bidirectional switch 12. As in the previous example, the biasing circuit 14 is again configured to bias the substrate 16 at the lower of the potentials V1, V2 applied to the sources S1, S2 of the bidirectional switch 12, namely VSUB=V2=0 V.

When the source S1 of the bidirectional switch 12 is biased at a potential V1=400 V and the source S2 of the bidirectional switch 12 is biased at a potential V2=0 V, the transistor TE4 is in an ON state and the transistor TE3 is in an OFF state. As such, the potential at node 20 is equal to the potential V2 applied to the source S2 of the bidirectional switch 12 plus the threshold voltage $V_{TH-TE4}$ (e.g., 1 V) of the transistor TE4. Thus, since the potential applied to the source S2 of the bidirectional switch 12 is V2=0 V, the potential at node 20 is the threshold voltage $V_{TH-TE4}$ of the transistor TE4.

The potential $V_{TH-TE4}$ at node 20 is applied to the gates of the DMODE transistors TD1, TD2 such that the transistor TD2 is in an ON state and the transistor TD1 is in an OFF state. When in the ON state, the source of the transistor TD2 is pulled to the potential V2=0 V applied to the source S2 of the bidirectional switch 12. In the OFF state, the transistor TD1 is pinched-off and the source of the transistor TD1 is at a potential equal to the pinch-off voltage $V_{PO-TD1}$ (e.g., 6 V) of the transistor TD1 plus the threshold voltage $V_{TH-TE4}$ (1 V) of the transistor TE4.

As shown in FIG. 3, the potential (0 V) at the source of the transistor TD2 is applied to the gate of the transistor TE1 and the potential (7 V) at the source of the transistor TD1 is applied to the gate of the transistor TE2. As a result, the transistor TE1 is in an OFF state and the transistor TE2 is in an ON state. The transistor TD1 thus operates as a biasing device to pull up the gate of the transistor TE2 to a voltage sufficient to turn on the transistor TE2. With the transistor TE2 in an ON state, the source of the transistor TE2 and the potential VSUB of the substrate 16 are pulled to the potential V2=0 V applied to the source S2 of the bidirectional switch 12. As in the previous example, the biasing circuit 14 is configured to clamp the voltage VSUB at the substrate 16 to the lower (V2=0 V) of the potentials V1, V2 applied to sources S1, S2 of the bidirectional switch 12. In comparing FIGS. 2 and 3, it should be noted that the biasing circuit 14 operates in a symmetrical manner to ensure that the substrate 16 is always biased to the lower of the potentials V1, V2 applied to the sources S1, S2 of the bidirectional switch 12.

In accordance with additional embodiments of the disclosure, the bidirectional switch 12 may be a GaN DMODE HEMT bidirectional switch rather than a GaN EMODE HEMT bidirectional switch. In this case, the biasing circuit 14 is again configured to bias the substrate at the lower of the potentials applied to the sources of the bidirectional switch. Also, in general, the biasing circuit 14 according to embodiments of the disclosure may be used between any two floating power nodes (supplies) to bias the substrate at the lower of the potentials applied to the floating power nodes.

The method and structure as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a center processor.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about," "approximately," and "substantially," are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

The invention claimed is:

1. A semiconductor device, comprising:
a high electron mobility transistor (HEMT) bidirectional switch including:
a first source at a first potential;
a second source at a second potential different than the first potential; and
a substrate;
a biasing circuit, coupled to the first source of the bidirectional switch and the second source of the bidirectional switch, for biasing the substrate at a potential equal to the lower of the first potential of the first source of the bidirectional switch and the second potential of the second source of the bidirectional switch, wherein the biasing circuit includes:
a first enhancement mode (EMODE) HEMT connected in series with a second EMODE HEMT, wherein a drain of the first EMODE HEMT is coupled to the first source of the bidirectional switch, a drain of the second EMODE HEMT is coupled to the second source of the bidirectional switch, and a source of the first EMODE HEMT and a source of the second EMODE HEMT are coupled to the substrate of the bidirectional switch,
a first depletion mode (DMODE) HEMT coupled in series with a second DMODE HEMT, wherein a drain of the first DMODE HEMT is coupled to the first source of the bidirectional switch, a drain of the second DMODE HEMT is coupled to the second source of the bidirectional switch, and a gate of the first DMODE HEMT is coupled to a gate of the second DMODE HEMT and the substrate of the bidirectional switch, and a source of the second DMODE HEMT is coupled to a gate of the first EMODE HEMT; and
a third EMODE HEMT coupled to a fourth EMODE HEMT, wherein a drain of the third EMODE HEMT is coupled to the first source of the bidirectional switch, a drain of the fourth EMODE HEMT is coupled to the second source of the bidirectional switch, a source of the third EMODE HEMT is coupled to a gate of the third EMODE HEMT and the gate of the first DMODE HEMT, and a source of the fourth EMODE HEMT is coupled to a gate of the fourth EMODE HEMT and a gate of the second DMODE HEMT, wherein, when the first potential of the first source of the bidirectional switch is greater than the second potential of the second source of the bidirectional switch, the first DMODE HEMT is pinched-off, the second EMODE HEMT is in an on state, and the substrate of the bidirectional switch is biased at the second potential.

2. The semiconductor device according to claim 1, wherein the bidirectional switch comprises an enhancement mode (EMODE) HEMT.

3. The semiconductor device according to claim 1, wherein, when the first potential of the first source of the bidirectional switch is greater than the second potential of the second source of the bidirectional switch, the source of the first DMODE HEMT is at a potential equal to a pinch-off voltage of the first DMODE HEMT and a threshold voltage of the fourth EMODE HEMT.

4. The semiconductor device according to claim 1, wherein, when the second potential of the second source of the bidirectional switch is greater than the first potential of the first source of the bidirectional switch:
the second DMODE HEMT is pinched-off;
the first EMODE HEMT is in an on state; and
the substrate of the bidirectional switch is biased at the first potential.

5. The semiconductor device according to claim 4, wherein, when the second potential of the second source of the bidirectional switch is greater than the first potential of the first source of the bidirectional switch, the source of the second DMODE HEMT is at a potential equal to a pinch-off voltage of the second DMODE HEMT and a threshold voltage of the third EMODE HEMT.

6. The semiconductor device according to claim 1, wherein the biasing circuit includes a first set of enhancement mode (EMODE) HEMTs, a set of depletion mode (DMODE) HEMTs coupled to the first set of EMODE HEMTs, and a second set of EMODE HEMTs coupled to the set of DMODE HEMTs.

7. The semiconductor device according to claim 6, wherein the bidirectional switch, the first set of EMDOE HEMTs, the set of DMODE HEMTs, and the second set of EMODE HEMTs are monolithically integrated on a gallium nitride (GaN) wafer.

8. A biasing circuit for biasing a substrate of a transistor device, comprising:
a first enhancement mode (EMODE) high electron mobility transistor (HEMT) in series with a second EMODE HEMT, wherein a source of the first EMODE HEMT and a source of the second EMODE HEMT are coupled to the substrate of the transistor device;
a first depletion mode (DMODE) HEMT in series with a second DMODE HEMT, wherein the first DMODE HEMT and the second DMODE MEMT are cross-coupled with the first EMODE HEMT and the second EMODE HEMT, a source of the first DMODE HEMT is coupled to a gate of the second EMODE HEMT, a source of the second DMODE HEMT is coupled to a gate of the first EMODE HEMT, and a gate of the first DMODE HEMT is coupled to a gate of the second DMODE HEMT and the substrate of the transistor device; and a third EMODE HEMT in series with a fourth EMODE HEMT, wherein a source and a gate of the third EMODE HEMT and a source and gate of the fourth EMODE HEMT are coupled to the substrate of the transistor device, a gate of the first DMODE HEMT, a gate of the second DMODE HEMT, a source of the third EMODE HEMT is coupled to a gate of the third EMODE HEMT and the gates of the first and second DMODE HEMTs, and a source of the fourth EMODE HEMT is coupled to a gate of the fourth EMODE HEMT and the gates of the first and second DMODE HEMTs, wherein a drain of each of the first EMODE HEMT, the first DMODE HEMT, and the third EMODE HEMT are coupled to a first source of the transistor device, and wherein a drain of each of the second EMODE HEMT, the second DMODE HEMT, and the fourth EMODE HEMT are coupled to a second source of the transistor device, wherein the first source of the transistor device is at a first potential and the second source of the transistor device is at a second potential different than the first potential, and wherein the biasing circuit is configured to bias the substrate of the transistor device at a potential equal to the lower of the first potential of the first source of the transistor device and the second potential of the second source of the transistor device, and when the first potential of the first source of the transistor device is greater than the second potential of the second source of the transistor device:
the first DMODE HEMT is pinched-off;
the second EMODE HEMT is in an on state; and
the substrate of the transistor device is biased at the second potential.

9. The biasing circuit according to claim 8, wherein the transistor device comprises a EMODE HEMT bidirectional switch.

10. The biasing circuit according to claim 8, wherein:
when the second potential of the second source of the transistor device is greater than the first potential of the first source of the transistor device:
the second DMODE HEMT is pinched-off;
the first EMODE HEMT is in an on state; and
the substrate of the transistor device is biased at the first potential.

11. A method for biasing a high electron mobility transistor (HEMT) bidirectional switch, the bidirectional switch including a substrate of a transistor device, a first source at a first potential, and a second source at a second potential different than the first potential, comprising:
biasing the substrate of the bidirectional switch with a biasing circuit at the first potential if the first potential is lower than the second potential; and
biasing the substrate of the bidirectional switch with the biasing circuit at the second potential if the second potential is lower than the first potential, wherein the biasing circuit includes:
a first enhancement mode (EMODE) high electron mobility transistor (HEMT) in series with a second EMODE HEMT, wherein a source of the first EMODE HEMT and a source of the second EMODE HEMT are coupled to the substrate of the transistor device;
a first depletion mode (DMODE) HEMT in series with a second DMODE HEMT, wherein the first DMODE HEMT and the second DMODE MEMT are cross-coupled with the first EMODE HEMT and the second EMODE HEMT, a source of the first DMODE HEMT is coupled to a gate of the second EMODE HEMT, a source of the second DMODE HEMT is coupled to a gate of the first EMODE HEMT, and a gate of the first DMODE HEMT is coupled to a gate of the second DMODE HEMT and the substrate of the transistor device; and a third EMODE HEMT in series with a fourth EMODE HEMT, wherein a source and a gate of the third EMODE HEMT and a source and gate of the fourth EMODE HEMT are coupled to the substrate of the transistor device, a gate of the first DMODE HEMT, and a gate of the second DMODE HEMT, a source of the third EMODE HEMT is coupled to a gate of the third EMODE HEMT and the gates of the first and second DMODE HEMTs, and a source of the fourth EMODE HEMT is coupled to a gate of the fourth EMODE HEMT and the gates of the first and second DMODE HEMTs, wherein a drain of each of the first EMODE HEMT, the first DMODE HEMT, and the third EMODE HEMT are coupled to a first source of the transistor device, and wherein a drain of each of the second EMODE HEMT, the second DMODE HEMT, and the fourth EMODE HEMT are coupled to a second source of the transistor device, wherein the first source of the transistor device is at a first potential and the second source of the transistor device is at a second potential different than the first potential, and wherein the biasing circuit is configured to bias the substrate of the transistor device at a potential equal to the lower of the first potential of the first source of the transistor device and the second potential of the second source of the transistor device, and when the first potential of the first source of the transistor device is greater than the second potential of the second source of the transistor device:

the first DMODE HEMT is pinched-off;

the second EMODE HEMT is in an on state; and the substrate of the transistor device is biased at the second potential.

\* \* \* \* \*